(12) United States Patent
Blosse et al.

(10) Patent No.: US 6,635,566 B1
(45) Date of Patent: Oct. 21, 2003

(54) METHOD OF MAKING METALLIZATION AND CONTACT STRUCTURES IN AN INTEGRATED CIRCUIT

(75) Inventors: Alain Blosse, Belmont, CA (US); Sanjay Thedki, Santa Clara, CA (US); Jianmin Qiao, Fremont, CA (US); Yitzhak Gilboa, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 17 days.

(21) Appl. No.: 09/593,967

(22) Filed: Jun. 15, 2000

(51) Int. Cl.[7] .......................................... H01L 21/4763
(52) U.S. Cl. ...................... 438/638; 438/622; 438/624; 438/687; 438/688; 438/675
(58) Field of Search ................................ 438/637, 638, 438/624, 672, 675, 666, 687, 688, 622, 668, 299, 256, 399, 595

(56) References Cited

U.S. PATENT DOCUMENTS

| 4,789,648 A | 12/1988 | Chow et al. ................ 437/225 |
| 4,933,743 A | 6/1990 | Thomas et al. |
| 4,954,142 A | 9/1990 | Car et al. |
| 5,093,279 A | 3/1992 | Andreshak et al. |
| 5,262,354 A | 11/1993 | Cote et al. |
| 5,312,777 A | 5/1994 | Cronin et al. |
| 5,371,047 A | 12/1994 | Greco et al. |
| 5,397,741 A | 3/1995 | O'Connor et al. |
| 5,453,639 A | 9/1995 | Cronin et al. |
| 5,496,771 A | 3/1996 | Cronin et al. |
| 5,578,524 A | * 11/1996 | Fukas et al. ................. 437/195 |
| 5,592,024 A | * 1/1997 | Aoyama et al. ............. 257/751 |
| 5,726,100 A | * 3/1998 | Givens ........................ 438/637 |
| 6,080,661 A | * 6/2000 | Bothra ........................ 438/637 |
| 6,121,098 A | * 9/2000 | Strobl ......................... 438/301 |
| 6,165,898 A | * 12/2000 | Jang et al. ................... 438/638 |
| 6,380,096 B2 | * 4/2002 | Hung et al. ................. 438/723 |

FOREIGN PATENT DOCUMENTS

| JP | 9320980 | * 12/1997 |
| JP | 2000-91440 | * 3/2000 |
| KR | 1999-0062003 | 7/1999 |

OTHER PUBLICATIONS

Cypress Semiconductor CAHNERS Internet Release, Jun. 5, 2000, *Dual–Damascene: Overcoming Process Issues*, 16pp.

* cited by examiner

*Primary Examiner*—Carl Whitehead, Jr.
*Assistant Examiner*—Thanhha Pham
(74) *Attorney, Agent, or Firm*—Oblon, Spivak, McClelland, Maier & Neustadt, P.C.

(57) ABSTRACT

The invention concerns a method for forming metallization and contact structures in an integrated circuit. The method involoves the steps of etching a trench in the trench dielectric layer a trench dielectric layer of a composite structure containing a semiconductor substrate comprising an active region, a gate structure thereover, and dielectric spacers adjacent to the gate structure, a contact dielectric layer; and the trench dielectric layer; etching the contact dielectric layer under conditions which do not damage the gate structure to form a first contact opening that exposes a region of the semiconductor substrate; and depositing a conductive material into the contact opening and the trench.

16 Claims, 4 Drawing Sheets

METHOD OF MAKING METALLIZATION AND CONTACT STRUCTURES IN AN INTEGRATED CIRCUIT

BACKGROUND OF THE INVENTION

1. Field of the Invention

The present invention relates to a method of forming metallization and contact structures in an integrated circuit, using a "dual damascene"-like procedure.

2. Discussion of the Background

During the preparation of integrated circuits, electrical connections between active regions of a semiconductor device are necessary.

One method of preparation involves the use of self-aligned contact (SAC) technology, which may comprise forming an opening through a dielectric material to an active region of a semiconductor device, wherein a gate structure adjacent to the active region may be protected during the contact opening etching step by encapsulation with a material which may have a lower etching rate than that of the surrounding dielectric material. In this fashion, one may reduce the total area consumed by functional circuitry while minimizing damage to the gate structure that might otherwise result from small errors in aligning the contact hole with the underlying conductive region.

After such an opening has been formed, it may be filled with a conductive material and planarized to form a self-aligned contact. Two or more SACs may be electrically connected by a local trench which may be formed by patterning a metal layer, such that the metal layer electrically connects the SACs, followed by depositing and optionally planarizing a dielectric material.

A "damacene" metallization layer, is an alternative to the pattered metal layer described above. A "damacene" metal layer is one where a trench or trough is formed in a dielectric material layer, then the trench is filled with a conductive metal. Damascene processes are becoming more widely used in semiconductor processing.

Problems observed in the interface between the SAC and the interconnect formed by damascene metallization have produced "dual damascene" processes, in which a channel is formed in a trench dielectric and an opening is formed in an underlying contact dielectric, both of which are then filled with a metal. This technology offers the advantages of simultaneously forming the contact and interconnect, which can result in reduced processing steps and a more highly conductive interface between the contact and interconnect structures.

Yen U.S. Pat. No. 5,861,676, reports a method of forming interconnects and contacts between elements in a semiconductor or integrated circuit.

Avanzino et al. U.S. Pat. No. 5,795,823 reports the fabrication of conductive lines and connecting vias using dual damascene with only one mask pattern. This is also reported by Avanzino et al, in U.S. Pat. No. 5,614,765.

Dai U.S. Pat. No. 5,877,076 reports a dual damascene process using opposite type two-layered photoresist.

Dai et al U.S. Pat. No. 5,876,075 reports forming dual damascene patterns using a single photoresist process.

Dai U.S. Pat. No. 5,882,996 discloses a method for patterning dual damascene interconnections using a developer soluble ARC interstitial layer.

Huang et al. U.S. Pat. No. 5,635,423 reports a modified dual damascene process in which an initial opening in a trench dielectric is enlarged while simultaneously extending a via opening through an etch stop layer and a via dielectric.

Qiao and Nulty U.S. Ser. No. 326,432, filed on Jun. 4, 1999 report a method and structure for making self-aligned contacts.

Blosse et al. IEEE 1999 International Interconnect Technology Conference, p 215–217 reports a comparison between counterbore dual damascene and self-aligned dual damascene in forming aluminum interconnects using PVD.

In spite of known techniques for forming contacts and interconnects, increases in device density and demands for increased processing efficiency, have spurred new efforts to effectively produce semiconductor interconnections.

SUMMARY OF THE INVENTION

One embodiment of the present invention involves a method of preparing interconnects and self-aligned contact structures using a dual damascene process.

Another embodiment of the present invention, involves a dual damacene method of forming metallization and self-aligned contact structures to active regions of a semiconductor device controlled by a gate structure.

Another embodiment of the present invention involves a dual damacene method of forming metallization and contact structures to an active region of a semiconductor device, controlled by a gate structure, in which the gate is protected during etching of the contact hole.

Another embodiment of the present invention, involves a dual damacene method of forming metallization and contact structures to an active region of a semiconductor device controlled by a gate structure in which the gate may be protected from etching during etching of the contact hole and in which etching of the trench dielectric is timed and which may be stopped before substantial etching of the contact dielectric occurs.

Another embodiment of the present invention, involves a dual damacene method of forming metallization and contact structures to an active region of a semiconductor device controlled by a gate structure in which the gate may be protected from etching during etching of the contact hole and in which etching of the contact hole through the contact dielectric layer may be conducted in the absence of a patterned photoresist.

These and other embodiments of the present invention are made possible by a dual damascene method that simultaneously forms a metal interconnect structure and one or more self-aligned contacts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Within one context of the present invention, a multi-level substrate comprising active regions and dielectric layers is etched to form both a trench and contact hole in which alignment of the contact hole mask is given processing latitudes using SAC techniques.

A multi-level substrate to be processed according to the present invention may be prepared according to conventional methods known to those of ordinary skill in the art. Suitable substrates comprising active regions, gate structures and dielectric layers may be prepared by conventional methods known to those of ordinary skill in the art.

Non-limiting examples of active regions to which an opening may be formed include a source or a drain region of a silicon, germanium or GaAs substrate (which may be lightly, heavily and/or very heavily doped with conventional N-dopants [such as nitrogen, phosphorous, arsenic, antimony, bismuth, tellurium, sulfur, mixtures thereof etc.] or P-dopants [such as B, Al, Ga, In, mixtures thereof, etc.]), silicide source and drain regions, metallization or conductive (metal) interconnect structures, field oxide regions, gate and/or word line structures (which may comprise [doped] polysilicon and/or a conventional metal silicide located in the first functional layer of a conductive material, above the substrate), etc.

Suitable gate structures, include those known to those of ordinary skill in the art, and which by way of example may comprise a MOS structure, a floating gate/control gate structure (e.g. for a non-volatile transistor), a SONOS transistor, etc.

Before depositing the contact dielectric, one may form spacers, which may prevent or inhibit etching of the gate or metallization structure while etching the contact hole, and which may protect conventional lightly doped source/drain structures during (source/drain) well implants. Suitable spacers may be formed by conventional methods known to those of ordinary skill in the art, such as depositing a dielectric spacer material by LPCVD or PECVD, followed by anisotropically etching the dielectric spacer material to form the spacer. A suitable dielectric spacer material may be selected by those of ordinary skill in the art and may provide a lower rate of etching relative to the surrounding contact dielectric material. For example, one suitable spacer material comprises a nitride such as silicon nitride (e.g. when the contact dielectric comprises an oxide) or a silicon oxide (e.g. when the contact dielectric comprises a nitride or a second compositionally distinct oxide). Typically the spacer layer will have a width, measured at the base, of from about 100 to about 1,500 Å, generally about 500 Å to 800 Å.

Within the context of the present invention it may also be desirable for the etch rate of the contact dielectric material to differ sufficiently from that of the gate structure (particularly the cap dielectric) under the conditions for etching the contact opening to avoid substantial etching of the gate structure and/or cap dielectric. Thus, it is within the scope of the present invention to form a protective cap dielectric layer over the gate from a material such as silicon nitride to increase the difference in etch rates between the contact dielectric layer and the gate structure. The formation of a cap dielectric and the selection of a suitable material is within the level of ordinary skill in the art, and may be based on conventional SAC techniques.

Suitable contact dielectric materials are deposited over the gate structure (and optionally planarized) by conventional methods known to those of ordinary skill in the art. Suitable contact dielectric materials may be selected by those of ordinary skill in the art such that the etching rate of the contact dielectric is sufficiently greater than that of the dielectric spacer material surrounding the gate structure under the conditions used to etch the contact dielectric to permit relatively complete etching of the contact dielectric material without substantial etching of the dielectric spacer material (and/or while reliably protecting the gate 12 from the contact hole etch process). For example, the contact dielectric layer may comprise one or more layers of dielectric materials such as silicon dioxide or a doped silicate glass such as fluorosilicate glass (FSG), borosilicate glass (BSG), phosphosilicate glass (PSG) and/or borophosphosilicate glass (BPSG). The contact dielectric material may be subject to a reflow step for densification and/or planarization after deposition. In addition, the contact dielectric material may be further planarized, for example by isotropic etching, annealing or chemical mechanical polishing (CMP), by processes known to those skilled in the art.

Further examples of contact dielectric materials include conventional oxides, nitrides, oxynitrides, and other dielectrics, such as spin-on glass (SOG), P-doped silicon oxide (P-glass), silicon nitride ($Si_xN_y$), silicon oxynitride (e.g., of the general formula $Si_aO_xN_y$ such that $(x/2)+(3y/4)=a$), $Al_2O_3$, metal nitrides such as aluminum nitride (e.g. AlN), $V_2O_5$, tetraethylorthosilicate-based oxides, titanium oxide, aluminum oxynitrides (e.g. of the general formula $Al_bO_xN_y$ such that $(2x/3)+y=b$), aluminosilicates and nitrides thereof (e.g. of the general formula $[Si_aAl_bO_xN_y]$ where $x=2a+3b/2$ and $y=4a/3+b$), and boron- and/or phosphorous-doped aluminates and aluminosilicates. Preferably, the contact dielectric material comprises a layer of PSG containing an atomic % of P (relative to the sum of P atoms and Si atoms) of 1–15%, preferably 3–12%, more preferably 5–11%.

The final thickness of the contact dielectric layer is not particularly limited, but preferably is within the range of about 0.3 to 3.0 μm, more preferably 0.4 to 2.0 μm, even more preferably 0.5 to 1.0 μm. A typical value for a 0.18 μm gate width technology may be 0.6 μm. The contact dielectric layer may comprise a single dielectric material or multiple layers of the same or different dielectric materials.

Overlying the contact dielectric is a trench dielectric material of the same, or preferably greater, thickness as the interconnect structure to be formed therein. Suitable trench dielectric materials may exhibit a higher rate of etching than the underlying contact dielectric material, under the conditions used to etch the trench dielectric.

Examples of trench dielectric materials include conventional oxides, nitrides, oxynitrides, and other dielectrics, such as borophosphosilicate glass (BPSG), borosilicate glass (BSG), fluorosilicate glass, phosphosilicate glass, undoped silicate glass, spin-on glass (SOG), P-doped silicon oxide (P-glass), silicon nitride ($Si_xN_y$), silicon dioxide, silicon oxynitride (e.g. of the general formula $[Si_aO_xN_y]$ such that $(x/2)+(3y/4)=a$), $Al_2O_3$, metal nitrides such as aluminum nitride [e.g. AlN], $Si_3N_4$, $V_2O_5$, tetraethylorthosilicate-based oxides and titanium oxide, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$ where $x=2a+3b/2$ and $y=4a/3+b$), boron- and/or phosphorous-doped aluminates and aluminosilicates. Preferably, the trench dielectric material is formed by plasma assisted vapor pyrolysis of TEOS (also known as tetraethylorthosilicate or tetraethoxysilane), which vapor may further include trimethylborate (TMB) as a boron source and/or phosphine as a phosphorus source, at a pressure of from about 0.3 to about 1 torr and at a temperature of approximately 640–660° C.

The thickness of trench dielectric layer is not particularly limited, but preferably is within the range of about 0.06 to 3.0 μm, more preferably 0.10 to 1.5 μm, even more preferably 0.15 to 1.0 μm. For a process having a 0.18 μm gate width, the trench thickness may be about 0.20 μm. The trench dielectric layer may comprise a single dielectric material, however, it may also comprise multiple layers of the same or different dielectric materials.

Figure 1:
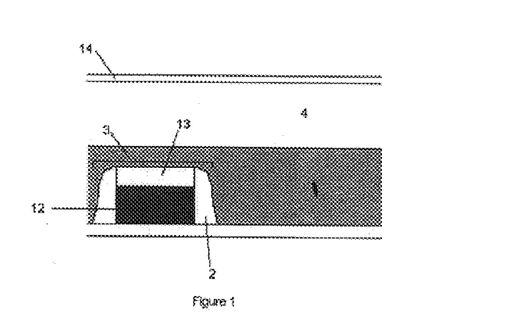
FIG. 1 illustrates a semiconductor structure comprising a contact dielectric layer, a trench dielectric layer and an anti-reflective coating layer.

In FIG. 1, a semiconductor structure is illustrated, comprising (i) a contact dielectric layer 1 surrounding a gate structure 3 which includes gate 12, "cap" dielectric 13, and (optionally) spacers 2, (ii) an overlying trench dielectric layer 4 and (iii) an anti-reflective coating layer 14. An active region (not illustrated) may lie in the substrate but adjacent to the gate structure 3.

A trench may be formed in the trench dielectric layer of the semiconductor structure by conventional photolithographic and etching techniques. However, to obtain greater resolution during photolithographic processing, an anti-reflective coating (ARC) layer 14 may be deposited on the exposed surface of the trench dielectric material prior to depositing a photoresist layer 5 for forming a trench mask (see FIG. 2). One suitable ARC may comprise a bottom anti-reflective coating (BARC), which may be an organic material such as those commercially available from Brewer Science (Rolla, Mo.), Clariant, Hitachi, or Tokyo Ohka (see for example, Singer, *Semiconductor International* March 1999, vol. 22 (3), pp. 55–59, the relevant portions of which are hereby incorporated by reference). Alternatively, an inorganic dielectric layer such as a dielectric ARC layer (e.g., $SiO_xN_y$, or DARC™, available from Applied Materials, Santa Clara, Calif.), a sacrificial ARC layer (e.g. TiN) or a multilayered structure comprising the previously mentioned ARC layer materials, may be employed. The dielectric ARC layer may be of a thickness of from about 200 Å to about 1,000 Å, typically 300 Å to 700 Å.

A photoresist layer for patterning the trench dielectric may be formed on the trench dielectric or ARC layer by conventional methods known to those of ordinary skill in the art, such as by spin coating. The resist material may then be conventionally patterned.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation and deposition of negative resist materials is within the level of skill of one of ordinary skill in the art and can be performed without undue experimentation. Specific non-limiting examples of negative resist systems include cresol epoxy novolac-based negative resists, as well as negative resists containing one or more photoreactive polymers as described in Kirk-Othmer Encyclopedia of Chemical Technology, 3rd Edition, vol 17, entitled "Photoreactive Polymers", pages 680–708, the relevant portions of which are hereby incorporated by references.

Positive resists have photoreactive components that are destroyed in the regions exposed to light. Typically the resist is removed in an aqueous alkaline solution, where the exposed region dissolves away. The preparation and deposition of positive resist materials is within the level of skill of one of ordinary skill in the art and can be performed without undue experimentation. Specific non-limiting examples of suitable positive resist systems include Shipley XP9402, JSR KRK-K2G and JSR KRF-L7 positive resists, as well as positive resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Examples of resist materials are also described by Baver et al, IBM Tech. Discl. Bull (USA) Vol. 22, No. 5 October 1979, pp 1855; Tabei, U.S. Pat. No. 4,613,404; Taylor et al, J. Vac. Sci. Technol. B. Vol. 13, No. 6, 1995, pp 3078–3081; Argitis et al, J. Vac. Sci. Technol. B. Vol. 13, No. 6, 1995, pp 3030–3034; Itani et al, J. Vac. Sci. Technol. B. Vol. 13, No. 6, 1995 pp 3026–3029; Ohfuji et al, J. Vac. Sci. Technol. B. Vol. 13, No. 6, 1995 pp 3022–3025; Trichkov et al, J. Vac. Sci. Technol. B. Vol. 13, No. 6, 1995, pp 2986–2993; Capodieci et al, J. Vac. Sci. Technol. B. Vol. 13, No. 6, 1995, pp 2963–2967; Zuniga et al, J. Vac. Sci. Technol. B. Vol. 13, No. 6, 1995, pp 2957–2962; Xiao et al, J. Vac. Sci. Technol. B. Vol. 13, No. 6, 1995, pp 2897–2903; Tan et al J. Vac. Sci. Technol. B. Vol. 13, No. 6, 1995, pp 2539–2544; and Mayone et al J. Vac. Sci. Technol. Vol. 12, No. 6, 1995, pp 1382–1382. The relevant portions of the above-identified references that describe the preparation and deposition of resist materials is hereby incorporated by reference. Selection of a resist material for the particular etching conditions is within the level of skill of one of ordinary skill in the art and can be performed without undue experimentation.

The photoresist layer may be patterned by conventional lithography steps known to those of ordinary skill in the art, such as by exposing the photoresist layer to radiation passed through a photolithography mask. Such selective exposure, followed by conventional developing, can produce a trench pattern, corresponding to the wiring pattern of a metallization structure. Depending on the type of photoresist material (i.e., positive or negative), selected portions of the photoresist material can be removed by developing with a suitable developer/solvent, and the resulting pattern may be heated (e.g., by baking in a furnace) prior to subsequent etching.

Figure 2:
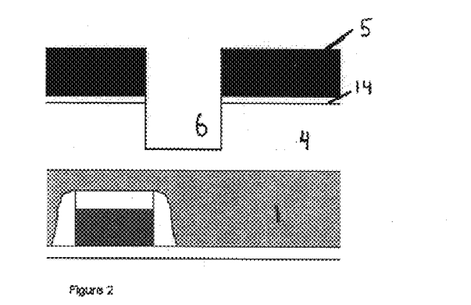
FIG. 2 illustrates a semiconductor structure further comprising a patterned trench mask and an etched trench dielectric layer.

A photoresist is deposited and patterned to form a trench (or local interconnect) mask 5 as illustrated in FIG. 2. The exposed ARC layer 14 and trench dielectric material layer 4 may be etched under conditions which remove the exposed trench dielectric material 4 without substantially etching the underlying contact dielectric material 1. Specific conditions may be selected by those of ordinary skill in the art and may differ depending on the depth of the trench and the nature or composition of the trench (and optionally the contact) dielectric layer(s). The trench dielectric material 4 may be effectively etched without substantial etching of the underlying contact dielectric layer. The backside of the wafer may be cooled with He at a pressure of 5–20 Torr, preferably about 14 Torr. In addition, suitable etching conditions are as described in co-pending application U.S. Ser. No. 09/326, 432 by Qiao and Nulty, the relevant portions of which are hereby incorporated by reference.

The etching gas may be those typically used by those of ordinary skill in the art in conventional reactive ion etching. Typically, halocarbons such as $CHF_3$, $C_4F_8$, $C_2F_6$, F-134, F-134a, $CF_4$, $SF_6$, $NF_3$ $SF_6$, $Cl_2$, HF, HCl, $CCl_4$, $C_nH_xF_y$ (where $n \geq 1$, $y \geq 1$, and $x+y=2n+2$) (see, for example, U.S. Ser. No. 08/683,407 and/or U.S. Pat. No. 5,468,342, the relevant portions of which are hereby incorporated by reference) and mixtures thereof, preferably $CHF_3$, $C_4F_8$ and/or F-134a and more preferably a mixture of $CHF_3$ and $C_4F_8$ (see U.S. Ser. No. 09/253,991 filed on Feb. 22, 1999). Carbon monoxide may also be incorporated into the etching gas as an optional component. Within the context of the present invention, the term "etching gas" refers to the components of the gas or gas mixture which produce active components of the plasma which etches the dielectric. Flow rates of etching gases described herein do not include oxygen or carrier gases, unless otherwise indicated.

The total flow rate of etching gas step is typically 5 to 500 SCCM, more preferably 15 to 300 SCCM and even more preferably 25 to 250 SCCM. Of this flow, up to 450 SCCM, preferably from 4 to 200 SCCM, may comprise a carrier gas such as Ne, Kr, Xe, CO, $CO_2$, $SO_2$, He, Ar, $N_2$ and mixtures thereof. Typically, the total flow rate of etching gas before striking the plasma is about the same or slightly more than the total flow rate of etching gas that may be used during an optional flash strike step or subsequent etch phase(s) or step(s) of the process. Suitable conditions are disclosed in U.S. Ser. Nos. 08/683,407, 08/577,751, and/or 08/935,705 and U.S. Pat. Nos. 5,468,342 and/or 5,562,801, the relevant portions of which are hereby incorporated by reference.

Under the selected etch conditions for the trench dielectric material, an etching rate may be determined, and etching under the selected set of conditions may be conducted for a time sufficient to substantially remove trench dielectric layer 4 to a predetermined depth (but at least without etching the contact dielectric material 1). The determination of the conditions and time(s) that provide such an etch is within the level of skill of those of ordinary skill in the art, and will typically take into consideration the thickness and composition of the trench dielectric layer and the parameters of the plasma. Suitable etchant gas may comprise $C_2H_2F_4$, $CHF_3$, $C_4F_8$ and $CF_4$, etching approximately 2,000 Å of a 3,000 Å thick trench dielectric layer. In one example, etching a PSG contact dielectric layer with an etchant comprising F134 and $CHF_3$ ($C_4F_8$ optional) and optionally in the presence of Ar, at a total pressure of 10–300 mTorr (preferably about 55 mTorr), a magnetic field of 10–50 gauss (preferably about 30 gauss), and at a power of 100–2,500 W (preferably from about 500 to about 1,500 W) for a length of time of about 3 minutes, may be sufficient to remove from 8,000 to 9,000 Å of the trench dielectric layer at a rate of 3,000 Å/min. The result is a trench 6 formed in the trench if dielectric layer 4.

Figure 3:
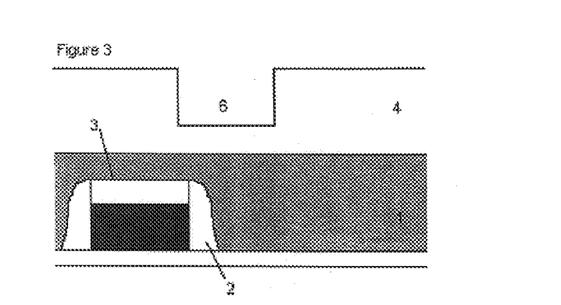
FIG. 3 illustrates a semiconductor structure comprising an etched trench dielectric layer.
Figure 3B:
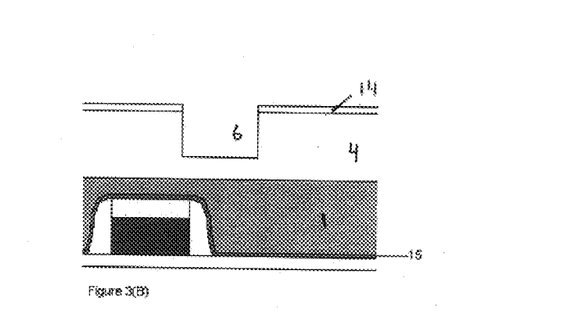
FIG. 3(B) illustrates a semiconductor structure comprising an etched trench dielectric layer, anti-reflective coating layer and an etch stop layer overlying the gate structure.

After the trench dielectric material has been etched in a pattern enabling formation of an interconnect structure 6, the trench photoresist mask 5 may be removed by conventional methods known to those of ordinary skill in the art (FIG. 3 and 3B), and a contact opening mask 7 may be formed thereon (see FIGS. 4, 4(A), 4(B) and 5). In FIG. 3B, an optional etch stop layer 15 of silicon nitride is illustrated. Formation of such an etch stop layer is within the level of skill of those of ordinary skill in the art, without undue experimentation. Suitable photoresist materials for, and methods of forming, the contact opening mask are as described above for the trench mask. The pattern formed in the contact opening mask is typically a circular pattern, corresponding to the desired shape of the contact. Patterning of the contact opening mask may be performed under suitable conditions known to those of ordinary skill in the art. A BARC layer as described above may also be used to enhance the patterning resolution of the contact hole mask.

After forming the contact opening mask, the exposed portions of the trench dielectric layer and the BARC or inorganic anti-reflective coating layer are remove, typically by etching. The trench dielectric material may be etched in the manner described above, and optionally, in a manner that is selective or non-selective with regard to the ARC and/or contact dielectric layer(s). Removal of the ARC layer may be under similar conditions used to etch an undoped silicate glass, for a total etch time of about 10 seconds. Non-limiting exemplary etching conditions for removing the BARC layer comprise exposing the portions of the BARC layer to be etched to a plasma comprising $CHF_3$ and/or $CF_4$, optionally in the presence of F-134 (preferably a mixture thereof) at a pressure of about 5–200 mTorr and a power of 100–1,000 watts in the absence of Ar. Backside cooling with He at a pressure of 2–30 Torr in the absence of a magnetic field is preferred.

Figure 4:
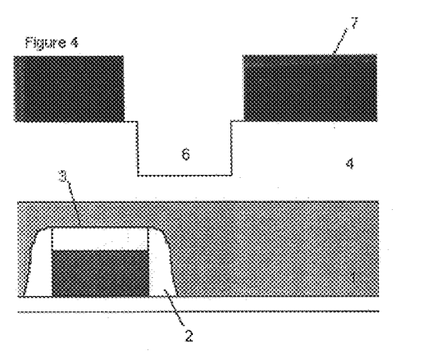
FIG. 4 illustrates a semiconductor structure comprising an etched trench dielectric layer, and a patterned contact opening mask.
Figure 4A:
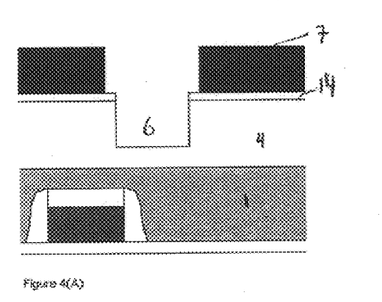
FIG. 4(A) illustrates a semiconductor structure comprising an etched trench dielectric layer, an anti-reflective coating layer and a patterned contact opening mask.
Figure 4B:
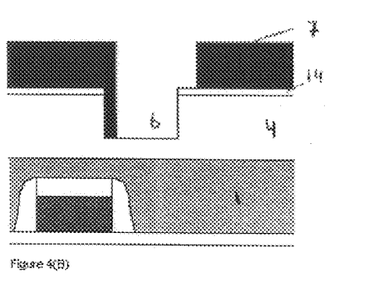
FIG. 4(B) illustrates a semiconductor structure comprising an etched trench dielectric layer, an anti-reflective coating layer and a patterned contact opening mask, in which the contact mask opening is not perfectly aligned with the etched trench.
Figure 5:
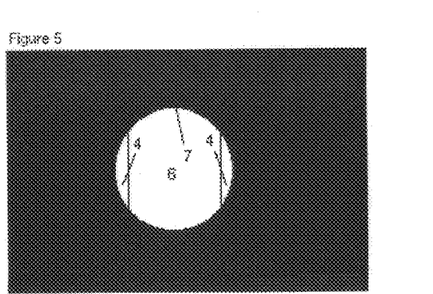
FIG. 5 illustrates a top view of the semiconductor structure illustrated in FIG. 4.

A top view of the structure of FIG. 4 is illustrated in FIG. 5, in which the side walls of the trench 6 formed in the trench dielectric layer 4 are shown, through the hole in the contact mask 7.

Of Using the contact opening mask 7, the exposed portion of the trench dielectric 4 may be removed under conditions as previously described for the removal of trench dielectric material. This may occur without substantial etching of the contact dielectric when the trench etch is selective for the trench dielectric relative to the contact dielectric. In one embodiment, at least some of the trench dielectric material below the trench 6 remains over the contact dielectric layer 1. In this embodiment, the contact dielectric layer underlying the trench 6 in regions other than those regions being etched is protected from etching by the overlying trench dielectric layer 4 during etching of the contact opening (the so-called "hard mask" embodiment).

Figure 6:
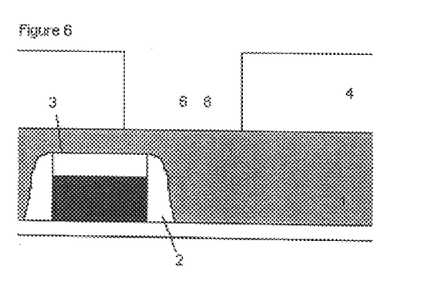
FIG. 6 illustrates a semiconductor structure comprising a trench and contact hole opening etched in the trench dielectric layer, where the trench dielectric layer functions as a hard mask for etching the contact dielectric layer.

In this embodiment, the trench dielectric layer 4 may be used as a "hard mask" for forming the contact opening in the contact dielectric, after removing (i.e., in the absence of) the patterned contact photoresist mask. In this embodiment, the contact mask 7 is used to pattern an opening in the trench dielectric layer 4 to expose the region(s) of the contact dielectric layer overlying the active region of the substrate to which the contact opening will be formed, then the contact mask 7 is removed prior to etching the contact opening through the contact dielectric layer 1. After removal of the contact mask layer 7, as illustrated in FIG. 6, the semiconductor structure comprises a trench dielectric layer, patterned with a trench 6 and an opening 8 to form a contact opening in the contact dielectric layer 1.

In the embodiment where the trench dielectric layer 4 comprises a pattern or "hard mask" for the contact opening, conditions should include (a) a trench dielectric thickness which is greater than the trench thickness (preferably by $\geq 100$ Å, more preferably by $\geq 200$ Å, and even more preferably by $\geq 300$ Å (typically by about 1,000 Å)) and (b) the contact dielectric material having a substantially different etch rate than the trench dielectric material when either material is etched. In this context, an etch rate for a first material is "substantially different" from the etch rate for a second material (alternatively, the etch may be considered "selective") if the ratio of the two etch rates is $\geq 5:1$, more preferably $\geq 10:1$, even more preferably $\geq 15:1$.

Prior to etching the contact openings, the trench 6 (and optionally opening 8) may be cleaned by plasma cleaning by a conventional oxygen plasma etch (which may optionally contain $CF_4$) then by a conventional sulfuric acid based wet cleaning.

Conditions for self-aligned contact etching may include one or more of the conditions listed in Table 1 below:

TABLE 1

| Condition | General Range | Preferred Range |
|---|---|---|
| RF power (W) | 100–1,500 | 400–600 |
| pressure (mTorr) | 10–300 | 30–80 |
| He cooling pressure (T) | 2–30 | 5–10 |
| $C_2H_2F_4$ (sccm) | 1–50 | 3–10 |
| $CHF_3$ (sccm) | 0–200 | 20–50 |
| Ar (sccm) | 0–200 | 50–150 |
| $C_4F_8$ (sccm) | 0–50 | 0–5 |
| Magnetic field (Gauss) | 0–50 | 10–30 |

Carbon monoxide may optionally be present.

Figure 7:
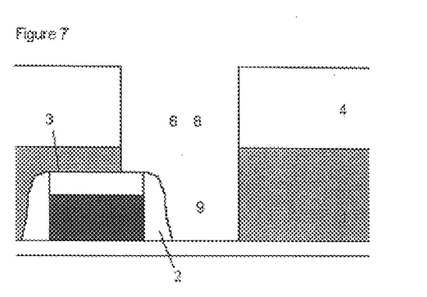
FIG. 7 illustrates a semiconductor structure comprising a trench etched in the trench dielectric layer and a contact hole etched in the contact dielectric layer.

Referring to FIG. 7, the contact dielectric layer 1 is etched to form a contact opening 9 to an underlying active region of the semiconductor substrate adjacent to gate structure 3. During etching of the contact opening 9, the patterned trench dielectric layer 4 may function as a "hard mask" for the contact dielectric layer 1. Greater tolerance to mask alignment errors during the patterning of opening 8 in trench dielectric layer 4 is afforded by self-aligned contact (SAC) techniques.

Etching the contact dielectric 1 using the trench dielectric 4 as a hard mask may be accomplished under conditions known to those of ordinary skill in the art. Suitable etching conditions are described in co-pending application U.S. Serial No. 09/326,432, filed on Jun. 4, 1999 by Qiao and Nulty. The etching gas(es), which may be the same as or different from the etching gas(es) for the trench etch step (but which are preferably selected to provide a selective etch), may be selected from those listed above for the trench etch step, and are selected from those that are useful in conventional reactive ion etching.

In an alternative embodiment, the trench dielectric layer 4 may be etched to any predetermined depth (but preferably to a depth of from about 0.5x to about 1.3x, preferably from about 0.7x to about 1.1x, where x is the thickness of the trench dielectric layer), and during the contact etch step, the contact opening mask 7 remains over the portions of the trench and contact dielectric layers not to be etched. When the contact opening is etched in the presence of the contact opening mask, the contact opening wall may be formed with a sloped profile (not illustrated in FIG. 6). Suitable etching conditions may be as described in co-pending application U.S. Ser. No. 09/326,432 by Qiao and Nulty. Alternatively, in this embodiment, the selectivity of etching the trench dielectric material relative to the contact dielectric material is not critical, and can be as low as 1:1. The etching gas(ses) may be the same as or different from the etching gas(ses) described above for the trench and/or contact opening etch steps. After etching the opening in the contact dielectric layer 1, the contact opening mask 7 may be removed by conventional methods known to those of ordinary skill in the art, the result being illustrated in FIG. 7.

Figure 8:
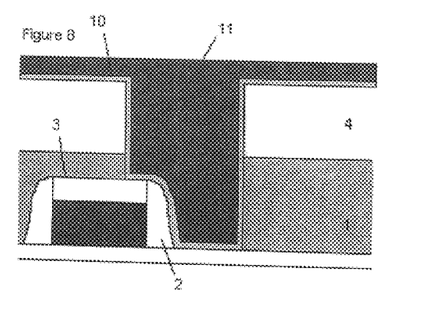
FIG. 8 illustrates a semiconductor structure further comprising a liner layer and a continuous self-aligned contact and interconnect structure.

FIG. 8 illustrates the device after depositing a bulk conductive material 11 in the contact opening and trench. Prior to deposition of the bulk conductive material 11, an optional liner, wetting and/or barrier layer 10 may be formed. The layer 10 may promote adherence of the conductive material to the dielectric material(s), as well as to a material or active region therebelow (e.g., a conductive material such as tungsten, $WSi_x$ or Al or doped polysilicon). The layer 10 may also act as a barrier to prevent or inhibit diffusion between the bulk conductive material and the underlying substrate. Layer 10 may also comprise a single layer of material or multiple layers of the same or different materials with independently selected chemical compositions and thicknesses.

Non-limiting examples of suitable liner/wetting/barrier layer materials include titanium, zirconium, haftium, tantalum, chromium, molybdenum, tungsten, copper, nickel, cobalt, noble metals such as ruthenium, rhodium, palladium, osmium, iridium, platinum, gold and silver, alloys thereof such as titanium-tungsten, aluminum-titanium or aluminum-silicon, and conductive nitrides thereof, such as tantalum nitride and titanium nitride. Preferably the liner/wetting/barrier layer is titanium, a conventional titanium-tungsten alloy or titanium nitride. When the liner/wetting/barrier layer is titanium, deposition of the liner/wetting/barrier layer is preferably followed by rapid thermal annealing (RTA) in an atmosphere comprising $N_2$ or $NH_3$.

The liner/wetting/barrier layer may be deposited by conventional methods known to those of ordinary skill in the art such as chemical or plasma vapor deposition, ionized metal plasma, sputtering, etc. Deposition may also be by a collimated process. The thickness of the liner/wetting/barrier layer is typically from about 50 to about 1000 Å thick, preferably from 100 to about 600 Å thick, more preferably from 150 to about 500 Å thick. Typically, the thickness is 700 Å as measured at a flat surface outside the contact. The thickness at the sidewall is typically 0.1 x the flat surface thickness, and the thickness at the bottom to the contact is typically 0.5 x the flat surface thickness.

While the liner layer may be deposited in an amount sufficient to cover the entire exposed surface of the wafer, within the scope of the present invention, it is preferably deposited in an amount sufficient to cover the uppermost surface of the dielectric layer, the side walls and bottom of the opening. During the deposition of the liner/wetting layer, it is preferable that the deposition be conducted in a directional manner. Directional deposition may be conducted by conventional methods known to those of ordinary skill in the art, for example by collimated sputtering or by Ion Metal Plasma (IMP) methods. In one embodiment, the collimation filter may have cells with a 1:1 aspect ratio (height:diameter) or greater.

A separate barrier layer may be formed in addition to a liner/adhesive layer. When the liner layer is Ti, a separate barrier layer of TiN or TiW is preferred. Such a barrier layer may be formed by methods known to those of ordinary skill in the art without undue experimentation.

The structures are now prepared for metal deposition with a conductive material, which is not particularly limited and which may include, for example aluminum, tungsten, copper, titanium, alloys and silicides thereof, etc., preferably aluminum, copper and/or tungsten, more preferably tungsten. Non limiting examples include an Al—0.5% Cu alloy, an Al—Si—0.5% Cu alloy, Al°, Al—Ge, Al—Si—Ge, W, Cu and Cu alloys. In a preferred embodiment, the conductive material is W.

Suitable deposition conditions are those known to those of ordinary skill in the art and may comprise depositing a single bulk layer of conductive material. Deposition may be conducted using an otherwise conventional physical vapor deposition apparatus, such as a commercially available sputtering apparatus, such as an ENDURA sputtering system by Applied Materials of Santa Clara, Calif. When depositing a layer of bulk metal (e.g., Al or W), a conventional two-step (cold, then hot) or three-step (cold, hot-slow, then hot-fast) process may be used, where "cold"=$T_1$, "hot"=$T_2$, and $T_1 \leq T_2-40°$ C., preferably $T_1 \leq T_2-60°$ C. In the first stage deposition, $SiH_4$ is added to the deposition atmosphere, and nucleation of the conductive material occurs. Suitable "three-step" deposition conditions are described in co-pending application U.S. Ser. No. 08/693,978, the relevant portions of which are hereby incorporated by reference. The distance from the sputtering target material to the wafer surface is generally from about 1' to about 2".

Figure 9:
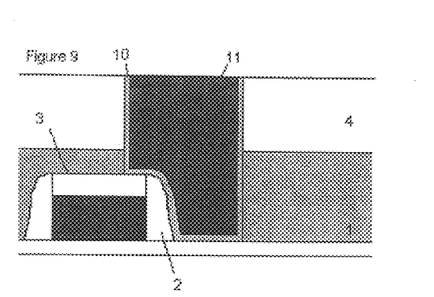
FIG. 9 illustrates a semiconductor structure comprising a continuous self-aligned contact and interconnect structure after planarization.
Figure 10:
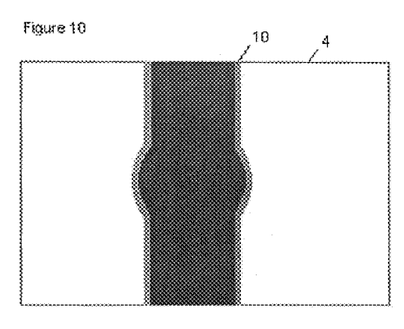
FIG. 10 illustrates a top view of the semiconductor structure illustrated in FIG. 9.
Figure 10B:
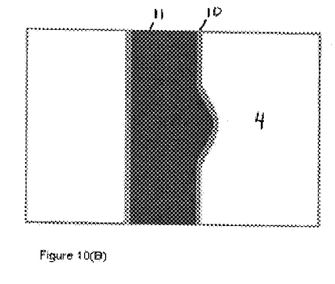
FIG. 10(B) illustrates a top view of the semiconductor structure illustrated in FIG. 9, in which the contact opening is not perfectly aligned with the trench.

Final processing may comprise planarizing the conductive material 11 and optional liner/wetting layer 10, by methods known to those of ordinary skill in the art, such as by chemical-mechanical polishing, the result being illustrated in FIGS. 9, 10 and 10(B), where FIGS. 10 and 10(B) illustrate a top view of the structure illustrated in FIG. 9, FIG. 10(B) specifically illustrating misalignment of the contact opening with the underlying conductive region, which none the less demonstrates effective formation of SAC metallization. Effective SAC metallization may also arise from the semiconductor device illustrated in FIG. 4(B). The conductive material is preferably planarized until its uppermost surface is substantially coplanar with an uppermost surface of the trench dielectric layer. Thereafter, the method may further comprise depositing an interlayer dielectric layer over the (coplanar) conductive material and trench dielectric layer by methods known to those skilled in the art. An interlayer dielectric comprising silicon nitride may be used as an interface between layers of a stacked structure (multilayered structure) comprising borderless contacts. Although the preferred interlayer dielectric layer comprises a TEOS layer, any suitable dielectric material from those described above for the trench dielectric layer may be selected. A low k dielectric may be used, as well as silicon nitride (or etch stop material) for border less contacts. In addition a plurality of layers (e.g. BARC, low k, protective) may be used in a multilayer structure. The interlayer dielectric layer, which may be from 1000 to 5000 Å thick, may then be planarized by methods known to those skilled in the art prior to further processing, for example by reflowing or chemical mechanical polishing.

The present invention also relates to an integrated circuit containing the above-described structure(s).

This application describes a method of simultaneously forming metallization and contact structures in an integrated circuit using a timed-etch procedure. A process for forming metallization and contact structures in an integrated circuit comprising an etch stop layer is described in a U.S. patent application filed concurrently, entitled "Method of Making Metallization and Contact Structures in an Integrated Circuit Comprising an Etch Stop Layer" (Applicant's Reference No. PM99026; Attorney Docket No. 7575-0066-77), the entire contents of which are hereby incorporated by reference.

The present application describes an etching procedure for making contact openings and trench structures through multiple layers of dielectric materials. The present application describes an etching procedure for making contact openings and trench structures through multiple layers of dielectric materials. It is within the scope of the present invention, to use an analogous method to simultaneously form metallization and contacts or vias to an i underlying metallization structure.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for forming metallization and contact structures in an integrated circuit comprising in sequential order:
   a) etching a trench dielectric layer of a composite structure comprising in sequential order:
      i) a semiconductor substrate comprising an active region, a gate structure thereover, and dielectric spacers adjacent to said gate structure;
      ii) a substantially planar contact dielectric layer;
      iii) a trench dielectric layer; and
      iv) a patterned photoresist;
      to form a trench in said trench dielectric layer under etch conditions which do not substantially etch said substantially planar contact dielectric layer;
   a') removing said patterned photoresist;
   a") forming a contact opening mask;
   b) etching said substantially planar contact dielectric layer under conditions which do not substantially damage said gate structure to form a first contact opening that exposes a region of said semiconductor substrate and a portion of at least one of said dielectric spacers; and
   c) depositing a conductive material into said first contact opening and said trench forming a contact structure in said first contact opening and a metallization in said trench.

2. The method of claim 1, further comprising forming a second contact opening in said trench dielectric layer corresponding to said first contact opening.

3. The method of claim 2, wherein said trench dielectric layer has a thickness at least 100 Å greater than that of said trench.

4. The method of claim 1, wherein etching said contact dielectric layer is conducted under conditions providing an etch rate of at least 5:1 relative to that of said gate structure.

5. The method of claim 1, further comprising forming a liner, wetting and/or barrier layer in said first contact opening and said trench.

6. The method of claim 5, wherein said liner, wetting and/or barrier layer has a thickness of from 50 Å to 1000 Å.

7. The method of claim 5, wherein said liner, wetting and/or barrier layer comprises a material selected from the group consisting of titanium, zirconium, hafnium, tantalum, chromium, molybdenum, tungsten, copper, nickel, cobalt, ruthenium, rhodium, palladium, osmium, iridium, platinum, gold, silver, titanium-tungsten, tantalum nitride and titanium nitride.

8. The method of claim 1, wherein said conductive material is selected from the group consisting of tungsten, aluminum, copper and alloys of one of said metals.

9. The method of claim 1, further comprising removing said conductive material until its uppermost surface is substantially coplanar with an uppermost surface of said trench dielectric layer.

10. The method of claim 9, further comprising depositing an interlayer dielectric layer over said coplanar conductive material and said trench dielectric layer.

11. The method of claim 1, wherein said composite structure further comprises an anti-reflective coating disposed between said trench dielectric layer and said patterned photoresist.

12. The method of claim 11, wherein said anti-reflective coating comprises an organic anti-reflective coating.

13. The method of claim 11, wherein said anti-reflective coating comprises a dielectric anti-reflective coating.

14. The method of claim 1, wherein said trench dielectric layer comprises an undoped silicate glass layer.

15. The method of claim 1, wherein said contact dielectric layer comprises a doped silicate glass.

16. The method of claim 15, wherein said doped silicate glass contact dielectric layer comprises a member selected from the group consisting of a phosphosilicate glass, a borophosphosilicate glass and a fluorosilicate glass.

* * * * *